(12) United States Patent
Hoffmann et al.

(10) Patent No.: US 12,360,459 B2
(45) Date of Patent: Jul. 15, 2025

(54) OPTICAL ASSEMBLY, METHOD FOR DEFORMING AN OPTICAL ELEMENT, AND PROJECTION EXPOSURE SYSTEM

(71) Applicant: Carl Zeiss SMT GmbH, Oberkochen (DE)

(72) Inventors: Tim Hoffmann, Aalen (DE); Vladimir Mitev, Aalen (DE); Eva Schneider, Aalen (DE); Ruediger Mack, Oberkochen (DE); Johannes Schurer, Heidenheim (DE); Maike Lorenz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 164 days.

(21) Appl. No.: 18/453,750

(22) Filed: Aug. 22, 2023

(65) Prior Publication Data

US 2023/0393485 A1    Dec. 7, 2023

Related U.S. Application Data

(63) Continuation of application No. PCT/EP2022/054318, filed on Feb. 22, 2022.

(30) Foreign Application Priority Data

Feb. 23, 2021    (DE) .......................... 102021201689.8

(51) Int. Cl.
*G03F 7/00* (2006.01)
*G02B 26/08* (2006.01)

(52) U.S. Cl.
CPC ..... *G03F 7/70266* (2013.01); *G02B 26/0858* (2013.01)

(58) Field of Classification Search
CPC ............ G03F 7/70266; G03F 7/70141; G02B 26/0858; G02B 7/185; G02B 27/18
See application file for complete search history.

(56) References Cited

U.S. PATENT DOCUMENTS 6,573,978 B1    6/2003   McGuire, Jr.
8,811,568 B2 *  8/2014   Bleidistel ............ G03F 7/70891
                                                         359/223.1

(Continued)

FOREIGN PATENT DOCUMENTS

DE    10 2008 009 600 A1    8/2009
EP          1 614 008 B1    12/2009
WO    WO 2020/247481 A2    12/2020

OTHER PUBLICATIONS

Translation of International Search Report for corresponding PCT Appl No. PCT/EP2022/054318, dated Jun. 13, 2022.

(Continued)

*Primary Examiner* — Hung V Nguyen
(74) *Attorney, Agent, or Firm* — Fish & Richardson P.C.

(57) ABSTRACT

An optical assembly has an optical element for influencing the beam path in a projection exposure apparatus and an actuator device for deforming the optical element. The actuator device has at least one photostrictive component and at least one light source. The photostrictive component is mechanically coupled to the optical element for the transmission of a tensile and/or compressive force in order to deform the optical element. The light source is configured for targeted illumination of the photostrictive component in order to induce the tensile and/or compressive force in the photostrictive component.

20 Claims, 4 Drawing Sheets

(56) References Cited

U.S. PATENT DOCUMENTS

| | | | |
|---|---|---|---|
| 8,894,227 B2* | 11/2014 | Knor | G02B 26/0825 |
| | | | 359/872 |
| 10,976,667 B2* | 4/2021 | Eva | G03F 7/70266 |
| 11,415,894 B2* | 8/2022 | Fingerhuth | G03F 7/70266 |
| 2006/0132747 A1 | 6/2006 | Singer et al. | |
| 2014/0009937 A1 | 1/2014 | Bonora et al. | |
| 2018/0074303 A1 | 3/2018 | Schwab | |
| 2019/0137755 A1 | 5/2019 | Finan et al. | |

OTHER PUBLICATIONS

Pilar, Jan et al., "Design of an Optimized Adaptive Optics System with a Photo-Controlled Deformable Mirror." *IEEE Photonics Technology Letters, IEEE, USA*, vol. 28, No. 13, Jul. 1, 2016 (Jul. 1, 2016), pp. 1422-1425, [retrieved on May 3, 2016].

* cited by examiner

OPTICAL ASSEMBLY, METHOD FOR DEFORMING AN OPTICAL ELEMENT, AND PROJECTION EXPOSURE SYSTEM

CROSS-REFERENCE TO RELATED APPLICATIONS

The present application is a continuation of, and claims benefit under 35 USC 120 to, international application PCT/EP2022/054318, filed Feb. 22, 2022, which claims benefit under 35 USC 119 of German Application No 10 2021 201 689.8, filed Feb. 23, 2021. The entire disclosure of each these applications is incorporated by reference herein.

FIELD

The disclosure relates to different variants of optical assemblies, having an optical element for influencing the beam path in a projection exposure apparatus and an actuator device for deforming the optical element. The disclosure furthermore relates to different variants of methods for deforming an optical element of a projection exposure apparatus and to a computer program product with program code for carrying out such a method. The disclosure moreover relates to a microlithographic projection exposure apparatus comprising an illumination system, which has a radiation source, an illumination optical unit, and a projection optical unit.

BACKGROUND

Projection exposure apparatuses or lithography apparatuses are used to produce integrated circuits with high precision. Here, the light of a radiation source is steered to a wafer to be exposed by way of optical elements such as mirrors and/or lens elements. The arrangement, position and shape of the optical elements decisively contribute to the quality of the exposure in this case.

On account of the advancing miniaturization of semiconductor circuits, there are typically ever more stringent demands put on both the resolution and the accuracy of projection exposure apparatuses. Correspondingly stringent demands are placed, for example, on the optical elements thereof and on the actuation of the optical elements.

In order to help achieve a relatively high resolution, EUV ("extreme ultraviolet") projection exposure apparatuses have been used for a number of years. Due to the high absorption of EUV radiation by almost all media, the EUV optical units usually are pure mirror systems and also be placed in a vacuum. However, ideal reflection of the EUV radiation cannot be achieved in practice, and so energy is deposited in the mirror optical units, for example at high radiation power levels, which can cause them to heat up and become deformed. This can ultimately lead to optical aberrations or imaging errors.

To increase the imaging accuracy of a projection exposure apparatus, experience has taught the targeted deformation of optical elements by way of actuable components in order to correct the imaging errors within the projection exposure apparatus. To this end, piezo elements are generally fastened to the optical elements. By actuating the piezo elements, it is possible in general to set profiles of the optical element, e.g., of a mirror, and consequently attempt to correct the optical system as a whole.

In general, the piezo elements are adhesively bonded to the back side of the mirror to be deformed. However, this can mean that the deformations caused by the piezo elements can be comparatively far removed from the optically active front side of the mirror, including because the mirrors desibly have a certain thickness in order to be thermally and mechanically sufficiently stable.

In can also be the case that integrate electrical supply wires or control lines are integrated into the optical assembly and sometimes even into the optical element in order to operate the piezo elements.

US 2019/137755 A1 proposes deforming a mirror using a polymeric material by laser irradiation, with the deformation being intended to be transferred to the reflecting surface of the optical element. In this way, a non-contact deformation should be possible.

SUMMARY

The present disclosure seeks to provide optical assemblies which facilitate a deformation of an optical element of a projection exposure apparatus with high precision and optionally with a simple technical design. The present disclosure also seeks to provide alternative variants of methods for deforming an optical element of a projection exposure apparatus, which allow deformation of the optical element with relatively high precision with an optionally simple technical design. The present disclosure also seeks to provide a computer program product for carrying out the disclosed methods. The disclosure also to provide a microlithographic projection exposure apparatus which has at least one optical assembly with an optical element that is deformable with relatively high precision in order to correct imaging errors.

An optical assembly is provided, having an optical element for influencing the beam path in a projection exposure apparatus and one or more actuator devices for deforming the optical element.

As a result of the actuator device, the optical element can be elastically deformable or at least substantially reversibly deformable. The deformation of the optical element can be implemented without hysteresis. The "deformation" should be understood to mean, for example, a deformation of the material of the optical element, which can cause, for example, a sectional change in length of the material of the optical element or sectional surface deformation of the optical element.

The optical element can be a mirror. The mirror can have a substantially flat or plane mirror surface, but can also be fully or partially curved, for example convex or concave. In general, however, the optical element can be any element that is suitable for influencing the beam path, for example a lens element or a reticle, possibly even entire assemblies such as projection optical units or structures such as mounting frames or a wafer holder. For the sake of completeness, it should be noted that, in general, it is also possible for a plurality of actuator devices to be provided for deforming the optical element.

The proposed deformation of the optical element can be used, for example, to correct imaging errors that are caused by inaccuracies or tolerances in the manufacture of the optical element or by an unwanted deformation of the optical element. For example, an optical element can heat up during operation and deform as a result. However, heating is not the only possible cause of unwanted deformation. For example, mechanical stresses in the reflective layer or in the main body of the optical element can also be relevant. Mechanical stresses in the main body of the optical element can occur, for example, if the main body is compacted with electron beams for the purpose of smoothing ("ICET"). The inaccuracies and/or deformations mentioned can be corrected or at least reduced by the proposed deformation of the optical element. In general, any imaging errors of any optical elements can be corrected by the proposed deformation.

According to the disclosure, provision is made for the actuator device to have at least one photostrictive component, which is mechanically coupled to the optical element for the transmission of a tensile and/or compressive force, in order to deform the optical element.

Photostrictive materials or components deform when exposed to light in a specific wavelength range. This phenomenon is called "photostriction." Photostriction is to be distinguished from a typical thermal deformation and combines the photoelectric effect and the piezoelectric effect.

According to the disclosure, the actuator device has at least one light source, which is configured for the targeted illumination of the photostrictive component in order to induce or cause the tensile and/or compressive force in the photostrictive component.

Through the proposed excitation of the photostrictive component via the light source, a non-contact deformation can be initiated in the optical element. There is no more need to provide electrical lines for controlling the actuator device.

The inventors have found that actuator amplitudes in an order of magnitude that can be suitable for the deformation of an optical element of a projection exposure apparatus are surprisingly achievable with the proposed solution.

According to the disclosure, provision is made for the optical element to have an optically active front side with a reflective layer for influencing a beam path from a radiation source and a back side facing away from the front side.

The back side of the optical element can optionally likewise be designed to be optically active. However, the back side need not optically active or is at least not used to influence the beam path from a radiation source.

The back side of the optical element can extend in plane parallel fashion or in at least substantially plane parallel fashion with respect to the front side, for example in the nondeformed basic state of the optical element. However, this is not mandatory within the scope of the disclosure. The front side and/or the back side may also have a curved shape, for example concave or convex.

The optically active front side of the optical element can be designed as a mirror surface, for example for reflecting or influencing the beam path of DUV ("Deep Ultra Violet") radiation, and optionally for influencing the beam path of EUV radiation.

The front side can have a reflective layer for influencing the beam path from the radiation source. The reflective layer may for example be a metallic layer for reflecting EUV radiation. The reflective layer may be applied cohesively to the front side of the optical element, for example adhesively bonded, vapor-deposited, applied additively, or connected to the optical element in some other way. In general, however, provision may also be made for the optical element to consist entirely of the reflective layer.

Various alternatives for arrangements of the photostrictive components and the light sources are proposed below, which have surprisingly been found to be suitable alternatives to the known prior art for enabling a deformation of the optical element with high precision with an optionally simple technical design. In this regard, the various independent claims represent alternative aspects of the disclosure.

According to a variant of the disclosure, provision is made for at least one of the photostrictive components to be arranged on the front side of the optical element next to the reflective layer and/or to be mechanically connected to the back side of the optical element.

According to a variant of the disclosure, provision is made for at least one of the light sources to be fixed on the back side of the optical element and/or for at least one of the photostrictive components to be arranged in the optical element between the reflective layer and the back side of the optical element and at least one of the light sources to be arranged in the optical element between the photostrictive component and the back side of the optical element.

According to a variant of the disclosure, provision is made for a plurality of independently controllable light sources to be used to illuminate the at least one photostrictive component.

According to a development of the disclosure, provision may be made for the optical element to have a main body that extends from the back side of the optical element to the reflective layer.

The main body can be made of a material that is transparent to the light from the light source or is at least partially transparent or sufficiently transparent for the operation of the actuator device. For example, the main body can be made of glass.

For example, if the main body is made of a material that is transparent to the light from the light source, the actuation of the photostrictive component or the illumination of the photostrictive component can be simple and the placement of the photostrictive component on or in the optical element can be effected highly flexibly.

In general, however, provision may also be made for the main body to be formed from a material that is not transparent to the light from the light source.

At this point it should be noted that in special cases the reflective layer can also be made transparent to the light from the light source (however, this is generally not the case).

According to a development of the disclosure, provision may be made for at least one of the photostrictive components to be arranged in the optical element between the reflective layer and the back side of the optical element.

The arrangement of the photostrictive component in the optical element, for example between the reflective layer and the back side of the optical element, optionally directly adjoining the reflective layer, can lead to a desirable and targeted deformation of the optical element. The optically active front side of the optical element can be influenced in a direct manner due to the actuator device being arranged immediately adjacent. In this case, the main body can be made of a material that is transparent to the light from the light source, as already proposed above.

In general, the photostrictive component can alternatively or additionally also be arranged elsewhere on the optical element or in the optical element.

In a development of the disclosure, provision may be made, for example, for at least one of the photostrictive components to be arranged on the front side of the optical element, optionally next to the reflective layer.

The photostrictive component can thus be arranged in a region of the optically active front side of the optical element that is not relevant for influencing the beam path. The function of the optical element for influencing the beam path from the radiation source is therefore not influenced by the actuator device.

In this way, too, a deformation can be introduced into the optical element, which, however, is less specific, but rather with a longer wavelength than the direct influencing by the arrangement of the photostrictive component behind the reflective layer.

It should be noted that the photostrictive components can optionally also be arranged on the front side of the optical element on the reflective layer if this region of the reflective layer is in a section of the optical element not used by the beam path or if the photostrictive component's behavior toward the radiation from the radiation source is passive, for example transparent.

In one configuration of the disclosure, provision can alternatively or additionally be made for at least one of the photostrictive components to be arranged on one side face or on a plurality of side faces of the optical element.

The arrangement of the photostrictive components on the side faces and/or laterally on the front side of the optical element can be desirable, for example, in order to counteract excessive deformation of the edges of the optical element. Naturally, the edges of a mirror deform more when it heats up than the middle part of the mirror, which can lead to relatively severe imaging errors, for example when the peripheral regions of the optical element are used to influence the beam path. This can be counteracted by the proposed arrangement.

In a development of the disclosure, provision may be made for at least one of the light sources to be arranged in the optical element between the photostrictive component and the back side of the optical element.

The light sources can be arranged, for example, in corresponding recesses in the optical element or in the main body of the optical element. However, provision may also be made for the light sources to be manufactured with the optical element or the main body of the optical element in a common layer structure. It can be ensured that the light sources remain sufficiently accessible for contacting, starting from the back side of the optical element.

The arrangement of the light sources in the optical element can be desirable if the at least one photostrictive component is arranged between the reflective layer and the back side of the optical element, on the front side of the optical element, and/or on the side faces of the optical element.

In a development of the disclosure, provision may be made for at least one of the photostrictive components to be mechanically connected to the back side of the optical element.

An arrangement of the photostrictive component on the back side of the optical element can be desirable, for example, if longer-wave deformations are to be introduced into the optical element, for example global modes. In this case, the optical element or the main body of the optical element can act on the mechanical deformation in the manner of a mechanical low-pass filter.

In this case, the photostrictive component can be attached directly to the back side of the optical element. Alternatively, however, provision can also be made for the photostrictive component to be connected to the optical element indirectly via an intermediate element attached to the back side of the optical element, for example if an even longer-wave mechanical deformation is provided. The intermediate element can thus serve as a compensating plate. The deformation of the actuator device can consequently initially have a direct effect on the intermediate element and subsequently be transmitted to the optical element via the intermediate element.

Depending on the application, a person skilled in the art may or may not provide an intermediate element and also vary the thickness and elasticity or the material properties of the intermediate element and/or of the main body of the optical element as desired.

Provision can additionally be made for the intermediate element itself to be attached only indirectly to the optical element via spacer elements or spacer struts distributed along the back side of the optical element. The influence of the photostrictive component on the optical element via the intermediate element can optionally be set even more optimally by using the spacer elements or spacer struts, for example by varying their geometry and/or material properties.

Provision can likewise optionally be made for the photostrictive components to be arranged between the back side of the optical element and a reference body spaced apart from the optical element and to be mechanically coupled on one side to the back side of the optical element and on the other to the reference body. The reference body can for example be a mount for the optical element, an attachment frame for the optical element (for example an attachment frame for an optical unit or a test stand) or a housing part for the optical element. In general, the reference body is statically coupled to a surrounding component.

Provision can be made for the reference body to be attached to the optical element or to the intermediate element via bearing units or bearing struts distributed along the back side of the optical element. In this case, the photostrictive components can be arranged between individual bearing units or bearing struts.

The photostrictive components can be bonded cohesively to the optical element, for example to the back side of the optical element (and/or to the intermediate element and/or to the reference body). In general, the photostrictive components can be connected to the optical element, the intermediate element and/or the reference body in any desired manner, for example also with a force fit or a form fit. For example, however, a cohesive connection, for example by adhesive bonding or vapor deposition, has proven to be suitable.

An integral formation of the photostrictive components with the optical element, the intermediate element and/or the reference body can also be provided, for example by an additive manufacturing technique.

In a development of the disclosure, provision may be made for at least one of the light sources to be fixed on the back side of the optical element.

In a configuration of the disclosure, provision may also be made for at least one of the light sources to be arranged on the back side of the optical element and to be aligned with the front side of the optical element in order to illuminate the photostrictive components. This configuration can be desirable, since in this case the light sources can be spaced from the optical element at almost any desired distance. In this way, an existing optical system is almost completely unaffected by the actuator device. Furthermore, in this case, the control and possibly the heat dissipation of the light source are possible in a simple manner.

In a development of the disclosure, provision may be made for the at least one photostrictive component to be aligned parallel to the optical element, for example running parallel to the back side and/or front side of the optical element.

In general, however, an arrangement of the photostrictive component that deviates from a parallel extent can also be provided. However, a parallel extent was found to be suitable and can also be implemented comparatively easily from a technical point of view.

In a development of the disclosure, provision may be made for the actuator device to have exactly one of the photostrictive components mentioned, which is designed as a contiguous material layer.

A targeted deformation of the optical element can be achieved by illuminating individual sections or regions of the photostrictive component.

A homogeneous material layer can be provided. In this case, the technical design of the actuator device can be simple.

In a development of the disclosure, however, provision can also be made for a plurality of photostrictive components to be selectively distributed along the optical element.

In this way, too, different profiles of the deformation are easily settable. In addition, with a selective distribution of the photostrictive components, less focused light sources can also be used to excite or introduce the deformation into the optical element.

Different thicknesses or layer thicknesses can be provided for the photostrictive components in order to specify in this way locally different scaling of the deformation amplitudes. For example, provision can be made for peripheral regions of the optical element to be deformed to a greater or lesser extent than middle regions of the optical element. The thickness of the photostrictive components arranged in the peripheral regions can thus be greater than in the middle regions.

In a development of the disclosure, provision may be made for at least one of the photostrictive components to be designed as a thin layer, for example with a layer thickness of between 1 nm and 500 µm, optionally with a layer thickness of between 500 nm and 100 µm.

The coefficient of expansion of the photostrictive component can be specified by variation of the layer thickness.

For example, the photostrictive components can have a layer thickness of 20 nm to 36 nm. This can possibly already be sufficient to bring about a satisfactory expansion or compression of the photostrictive component for a deformation of the optical element.

For example, a stroke or an actuator amplitude of 1 nm to 5 nm can be sufficient to cause a satisfactory deformation. In general, however, larger or smaller deformation amplitudes can also be provided.

In a development of the disclosure, provision may be made for at least one of the photostrictive components to be made from BiFeO3 ("bismuth ferrite") or PbTiO3 ("lead titanate").

The reaction time of the materials mentioned can be sufficiently short. The inventors have also found that for example the two materials mentioned may be suitable for use in a projection exposure apparatus, since they can already cause a sufficient deformation amplitude in sufficiently thin layers, for example in layers of from 600 nm to 90 µm. For crystals made of BiFeO3, the coefficient of expansion can be 0.003%, for example, which means that a layer which is about 90 µm thick can already achieve a deformation amplitude of 2.7 nm at a power of 326 W/m2 in the case of illumination with light having a wavelength of 365 nm. Thin films made of BiFeO3 can show an additionally significantly increased photostriction with an expansion coefficient of 0.46%, wherein layer thicknesses of 600 nm can already cause a deformation amplitude of 2.7 nm, since other physical processes can additionally take place in thin films due to the almost two-dimensional geometry.

In order to further utilize the increased effect of thin layers or thin films of the photostrictive component, provision may be made in an embodiment of the disclosure for a plurality of thin layers of the photostrictive component to be stacked, optionally separated by respective insulation layers. The respective individual layers are thus able to absorb part of the light from the light source, with the remaining part being able to activate the underlying layers. In this way, even larger deformation amplitudes can be achieved.

In general, photostriction occurs in many different material classes, all of which can potentially be suitable for forming the at least one photostrictive component. In order to achieve a large and therefore desirable effect within the scope of the disclosure, a suitable ferroelectric material (such as SbSI crystals or ferroelectric ceramics such as PLZT), a chalcogenide glass (e.g., As2Se3), and/or an organic polymer can be provided. These can each be designed as a thick layer or thin layer.

In a configuration of the disclosure, provision may be made for the optical element or at least the main body of the optical element to be formed (completely or partially) from the photostrictive component.

The effort involved in applying the photostrictive component to the optical element or in connecting it to the optical element can thus be omitted. One possibility for realizing the configuration mentioned can be, for example, doping the optical element or the main body with a further component (or some other admixture) in order to produce a photostrictive component overall. This can be done, for example, directly during production (e.g., glass production) of the optical element.

In a development of the disclosure, provision may be made for at least one of the light sources to be designed as a laser.

The light source can be configured to emit monochromatic light.

According to a development of the disclosure, provision may be made for at least one of the light sources to be configured to emit light having a wavelength of between 100 nm and 1000 nm, optionally having a wavelength of between 200 nm and 800 nm, such as having a wavelength of between 350 nm and 700 nm, for example having a wavelength of 365 nm. In general, however, wavelengths smaller than 100 nm or larger than 1000 nm can also be provided.

The expansion or the actuator amplitude of the photostrictive component can depend on the absorbed luminous power and thus for example on the wavelength. Different photostrictive materials can have different sensitivities to different wavelengths of light.

In a development of the disclosure, provision may be made for at least one of the light sources to be settable with regard to the wavelength, the intensity, the focusing and/or the alignment of the emitted light.

In this way, the deformation can be set in a desirable manner by the electrical control of the at least one light source.

In a development of the disclosure, provision may be made for at least one of the light sources to have an optical device, for example one or more lens elements, one or more micromirrors and/or one or more light filters (e.g., LCD units), to influence the beam path and/or the properties of the emitted light.

For example, with a sufficient setting accuracy of the light source, it can be possible to provide only one light source or at least a reduced number of light sources for illuminating the at least one photostrictive component.

In a development of the disclosure, however, provision may also be made for the actuator device to have a plurality of the light sources mentioned, which can each be controlled independently of one another to illuminate the at least one photostrictive component.

The use of a plurality of light sources that can be controlled independently of one another can be used.

According to a development of the disclosure, the optical assembly can have a control device for controlling the at least one light source in order to illuminate the at least one photostrictive component in such a way that an intended deformation occurs on the optical element.

The control device may be in the form of a microprocessor. Instead of a microprocessor, any further device for implementing the control device may be provided, for example one or more arrangements of discrete electrical component parts on a printed circuit board, a programmable logic controller (PLC), an application-specific integrated circuit (ASIC) or any other programmable circuit, for example a field programmable gate array (FPGA), a programmable logic array (PLA) and/or a commercially available computer.

The disclosure also relates to a method for deforming an optical element of a projection exposure apparatus. Provision is made for at least one light source to illuminate in a targeted manner a photostrictive component which is mechanically coupled to the optical element for the transmission of a tensile and/or compressive force in order to induce a tensile and/or compressive force in the photostrictive component to deform the optical element. The various variants of the methods are disclosed herein.

It is therefore proposed to use photostrictive materials to deform for example mirrors of a projection exposure apparatus, optionally an EUV lithography optical unit, for the purpose of optical correction. A photostrictively deformable mirror can thus be provided, for example as an alternative to using piezo elements or other actuators for deforming the mirror.

The installation position and number of the photostrictive components in the optical element can vary, as described above and below. The same applies to the number and positioning of the light sources that illuminate the photostrictive component and thus manipulate it in a targeted manner.

The disclosure moreover relates to a computer program product having program code for carrying out a method for deforming an optical element according to the explanations given above and below when the program is executed on a control device, for example the control device of the above-described optical assembly.

For example, the disclosure is suitable for use within the projection exposure apparatus mentioned below or, in general, for use in lithography optical units. However, in general the disclosure may be suitable for any desired applications in which optical elements are intended to be deformed, for example also for applications in aerospace and astronomy, and for military applications.

The disclosure also relates to a microlithographic projection exposure apparatus comprising an illumination system, which has a radiation source, an illumination optical unit, and a projection optical unit. The illumination optical unit and/or the projection optical unit comprises at least one optical assembly as per the explanations given above and below.

The disclosure is suitable for example for correcting imaging errors of the projection exposure apparatus by deformation of the optical element of the optical assembly.

With the proposed use of the photostrictive component for deforming the optical element it is possible to provide a high-precision system that is easy to implement technically and has little influence on the overall system of the projection exposure apparatus, since electrical wiring in or adjoining the optical element can be avoided.

The disclosure is suitable, inter alia, for use with a microlithographic DUV projection exposure apparatus, but for example for use with an EUV projection exposure apparatus. A possible use of the disclosure also relates to immersion lithography.

Features described in conjunction with one of the subjects of the disclosure, specifically the optical assembly, the method for deforming an optical element, the computer program product and the projection exposure apparatus, are also implementable for the other subjects of the disclosure. Likewise, features specified in conjunction with one of the subjects of the disclosure can also be understood in relation to the other subjects of the disclosure.

Additionally, it should be noted that terms such as "comprising", "having" or "with" do not exclude other features or steps. Furthermore, words such as "a (n)" or "the" which indicate single steps or features do not preclude a plurality of features or steps—and vice versa.

However, in a puristic embodiment of the disclosure, provision may be made for the features introduced in the disclosure using the terms "comprising", "having" or "with" to be an exhaustive enumeration. Accordingly, one or more enumerations of features can be considered to be exhaustive within the scope of the disclosure, for example when respectively considered for each claim.

It should be noted that labels such as "first" or "second", etc. are used predominantly for reasons of distinguishability between respective apparatus or method features and are not necessarily intended to indicate that features require one another or are related to one another.

It should further be emphasized that the values and parameters described in the present context also include deviations or variations from the respectively specified value or parameter of ±10% or less, optionally ±5% or less, such as ±1% or less, and for example ±0.1% or less, provided these deviations are not precluded when implementing the disclosure in practice. The specification of ranges by a start and end value also encompasses all the values and fractions included by the respectively specified range, for example the start and end values and a respective mean value.

The disclosure also relates to an optical assembly having an optical element and an actuator device for influencing the optical element, wherein the actuator device has at least one photostrictive component and at least one light source, wherein the photostrictive component is mechanically coupled to the optical element to deform, align and/or position the optical element, and wherein the light source is configured to illuminate the photostrictive component in a targeted manner. The disclosure provides embodiments and variants of this optical assembly.

Exemplary embodiments of the disclosure are described in detail below with reference to the drawing.

The figures each show exemplary embodiments in which individual features of the present disclosure are illustrated in combination with one another. Features of any exemplary embodiment are also implementable independently of the other features of the same exemplary embodiment, and may readily be combined accordingly by a person skilled in the art to form further viable combinations and sub-combinations with features of other exemplary embodiments.

In the figures, functionally identical elements are given the same reference signs.

DETAILED DESCRIPTION

Figure 1:
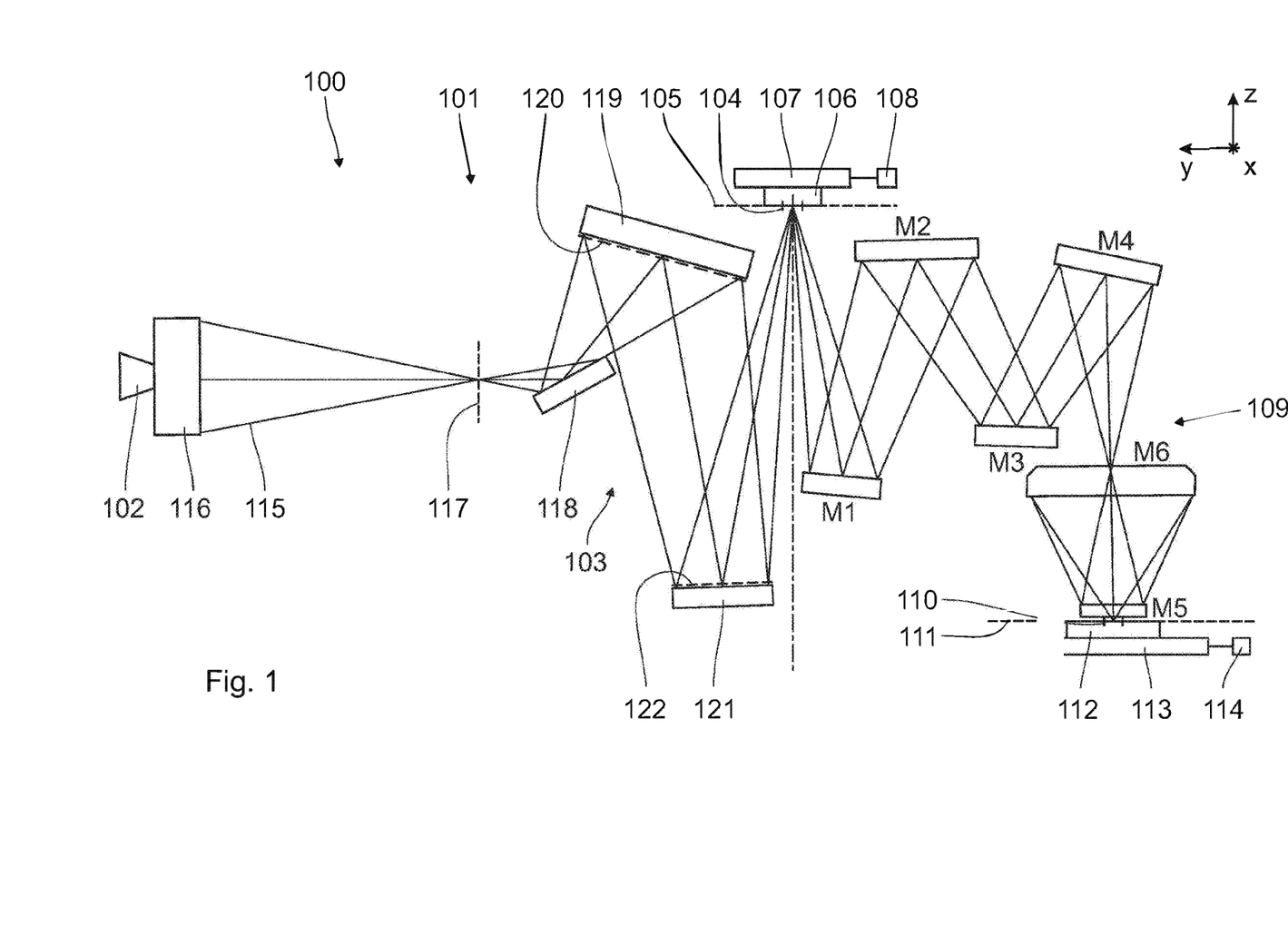
FIG. 1 shows a meridional section of an EUV projection exposure apparatus.

With reference to FIG. 1, certain component parts of a microlithographic EUV projection exposure apparatus 100 are initially described below in exemplary fashion. The description of the basic structure of the EUV projection exposure apparatus 100 and of the component parts thereof should not be interpreted restrictively here.

An illumination system 101 of the EUV projection exposure apparatus 100 comprises, besides a radiation source 102, an illumination optical unit 103 for the illumination of an object field 104 in an object plane 105. What is exposed here is a reticle 106 arranged in the object field 104. The reticle 106 is held by a reticle holder 107. The reticle holder 107 is displaceable for example in a scanning direction by way of a reticle displacement drive 108.

In FIG. 1, a Cartesian xyz-coordinate system is plotted to aid the explanation. The x-direction runs perpendicularly into the plane of the drawing. The y-direction runs horizontally, and the z-direction runs vertically. In FIG. 1, the scanning direction runs in the y-direction. The z-direction runs perpendicular to the object plane 105.

The EUV projection exposure apparatus 100 comprises a projection optical unit 109. The projection optical unit 109 serves for imaging the object field 104 into an image field 110 in an image plane 111. The image plane 111 extends parallel to the object plane 105. Alternatively, an angle that differs from 0° between the object plane 105 and the image plane 111 is also possible.

A structure on the reticle 106 is imaged onto a light-sensitive layer of a wafer 112 arranged in the region of the image field 110 in the image plane 111. The wafer 112 is held by a wafer holder 113. The wafer holder 113 is displaceable for example in the y-direction by way of a wafer displacement drive 114. The displacement, firstly, of the reticle 106 by way of the reticle displacement drive 108 and, secondly, of the wafer 112 by way of the wafer displacement drive 114 can be implemented so as to be mutually synchronized.

The radiation source 102 is an EUV radiation source. The radiation source 102 emits EUV radiation 115 for example, which is also referred to below as used radiation or illumination radiation. For example, the used radiation 115 has a wavelength in the range between 5 nm and 30 nm. The radiation source 102 can be a plasma source, for example an LPP source ("laser produced plasma") or a GDPP source ("gas discharged produced plasma"). It may also be a synchrotron-based radiation source. The radiation source 102 can be a free electron laser (FEL).

The illumination radiation 115 emerging from the radiation source 102 is focused by a collector 116. The collector 116 may be a collector with one or more ellipsoidal and/or hyperboloidal reflection surfaces. The at least one reflection surface of the collector 116 can be impinged upon by the illumination radiation 115 with grazing incidence (GI), which is to say with angles of incidence greater than 45°, or with normal incidence (NI), which is to say with angles of incidence less than 45°. The collector 116 can be structured and/or coated, firstly, for optimizing its reflectivity for the used radiation 115 and, secondly, for suppressing extraneous light.

Downstream of the collector 116, the illumination radiation 115 propagates through an intermediate focus in an intermediate focal plane 117. The intermediate focal plane 117 can represent a separation between a radiation source module, having the radiation source 102 and the collector 116, and the illumination optical unit 103.

The illumination optical unit 103 comprises a deflection mirror 118 and, downstream thereof in the beam path, a first facet mirror 119. The deflection mirror 118 can be a plane deflection mirror or, alternatively, a mirror with a beam-influencing effect that goes beyond the purely deflecting effect. As an alternative or in addition, the deflection mirror 118 may be in the form of a spectral filter that separates a used light wavelength of the illumination radiation 115 from extraneous light of a wavelength deviating therefrom. If the first facet mirror 119 is arranged in a plane of the illumination optical unit 103 that is optically conjugate to the object plane 105 as a field plane, it is also referred to as a field facet mirror. The first facet mirror 119 comprises a multiplicity of individual first facets 120, which are also referred to below as field facets. Only a few of these facets 120 are illustrated in FIG. 1 in exemplary fashion.

The first facets 120 can be embodied in the form of macroscopic facets, for example in the form of rectangular facets or in the form of facets with an arcuate peripheral contour or a peripheral contour of part of a circle. The first facets 120 may be embodied as plane facets or alternatively as convexly or concavely curved facets.

As is known for example from DE 10 2008 009 600 A1, the first facets 120 themselves can also each be composed of a multiplicity of individual mirrors, for example a multiplicity of micromirrors. The first facet mirror 119 may for example be in the form of a microelectromechanical system (MEMS system). For details, reference is made to DE 10 2008 009 600 A1.

The illumination radiation 115 travels horizontally, that is to say in the y-direction, between the collector 116 and the deflection mirror 118.

In the beam path of the illumination optical unit 103, a second facet mirror 121 is arranged downstream of the first facet mirror 119. Provided the second facet mirror 121 is arranged in a pupil plane of the illumination optical unit 103, it is also referred to as a pupil facet mirror. The second facet mirror 121 can also be arranged at a distance from a pupil plane of the illumination optical unit 103. In this case, the combination of the first facet mirror 119 and the second facet mirror 121 is also referred to as a specular reflector. Specular reflectors are known from US 2006/0132747 A1, EP 1 614 008 B1, and U.S. Pat. No. 6,573,978.

The second facet mirror 121 comprises a plurality of second facets 122. In the case of a pupil facet mirror, the second facets 122 are also referred to as pupil facets.

The second facets 122 may likewise be macroscopic facets, which may for example have a round, rectangular or hexagonal boundary, or may alternatively be facets composed of micromirrors. In this regard, reference is likewise made to DE 10 2008 009 600 A1.

The second facets 122 may have plane reflection surfaces or alternatively reflection surfaces with a convex or concave curvature.

The illumination optical unit 103 consequently forms a double-faceted system. This basic principle is also referred to as fly's eye integrator.

It can be desirable to arrange the second facet mirror 121 not exactly in a plane that is optically conjugate to a pupil plane of the projection optical unit 109.

With the aid of the second facet mirror 121, the individual first facets 120 are imaged into the object field 104. The second facet mirror 121 is the last beam-shaping mirror or indeed the last mirror for the illumination radiation 115 in the beam path upstream of the object field 104.

In a further embodiment of the illumination optical unit 103 (not illustrated), a transfer optical unit can be arranged in the beam path between the second facet mirror 121 and the object field 104, the transfer optical unit contributing to the imaging of the first facets 120 into the object field 104, for example. The transfer optical unit can comprise exactly one mirror or, alternatively, two or more mirrors, which are arranged in succession in the beam path of the illumination optical unit 103. For example, the transfer optical unit can comprise one or two mirrors for normal incidence (NI mirror, "normal incidence" mirror) and/or one or two mirrors for grazing incidence (GI mirror, "grazing incidence" mirror).

In the embodiment shown in FIG. 1, the illumination optical unit 103 comprises exactly three mirrors downstream of the collector 116, specifically the deflection mirror 118, the field facet mirror 119, and the pupil facet mirror 121.

The deflection mirror 118 can also be dispensed with in a further embodiment of the illumination optical unit 103, and so the illumination optical unit 103 can then have exactly two mirrors downstream of the collector 116, specifically the first facet mirror 119 and the second facet mirror 121.

The imaging of the first facets 120 into the object plane 105 via the second facets 122 or using the second facets 122 and a transfer optical unit is, in general, only approximate imaging.

The projection optical unit 109 comprises a plurality of mirrors Mi, which are numbered in accordance with their arrangement in the beam path of the EUV projection exposure apparatus 100.

In the example illustrated in FIG. 1, the projection optical unit 109 comprises six mirrors M1 to M6. Alternatives with four, eight, ten, twelve or any other number of mirrors Mi are likewise possible. The penultimate mirror M5 and the last mirror M6 each have a passage opening for the illumination radiation 115. The projection optical unit 109 is a twice-obscured optical unit. The projection optical unit 109 has an image-side numerical aperture which is greater than 0.5 and which can also be greater than 0.6 and, for example, can be 0.7 or 0.75.

Reflection surfaces of the mirrors Mi can be in the form of free-form surfaces without an axis of rotational symmetry. Alternatively, the reflection surfaces of the mirrors Mi can be designed as aspherical surfaces with exactly one axis of rotational symmetry of the reflection surface shape. Just like the mirrors of the illumination optical unit 103, the mirrors Mi can have highly reflective coatings for the illumination radiation 115. These coatings can be designed as multilayer coatings, for example with alternating layers of molybdenum and silicon.

The projection optical unit 109 has a large object-image offset in the y-direction between a y-coordinate of a center of the object field 104 and a y-coordinate of the center of the image field 110. In the y-direction, this object-image offset can be of approximately the same magnitude as a z-distance between the object plane 105 and the image plane 111.

For example, the projection optical unit 109 can have an anamorphic embodiment. For example, it has different imaging scales $\beta x$, $\beta y$ in the x- and y-directions. The two imaging scales $\beta x$, $\beta y$ of the projection optical unit 109 can be ($\beta x$, $\beta y$)=(+/−0.25, +/−0.125). A positive imaging scale $\beta$ means imaging without image inversion. A negative sign for the imaging scale $\beta$ means imaging with image inversion.

The projection optical unit 109 consequently leads to a reduction in size with a ratio of 4:1 in the x-direction, which is to say in a direction perpendicular to the scanning direction.

The projection optical unit 109 leads to a reduction in size of 8:1 in the y-direction, which is to say in the scanning direction.

Other imaging scales are likewise possible. Imaging scales with the same signs and the same absolute values in the x-direction and y-direction are also possible, for example with absolute values of 0.125 or 0.25.

The number of intermediate image planes in the x-direction and in the y-direction in the beam path between the object field 104 and the image field 110 can be the same or can differ depending on the embodiment of the projection optical unit 109. Examples of projection optical units with different numbers of such intermediate images in the x- and y-directions are known from US 2018/0074303 A1.

In each case one of the pupil facets 122 is assigned to exactly one of the field facets 120 for forming in each case an illumination channel for illuminating the object field 104. For example, this can yield illumination according to the Köhler principle. The far field is decomposed into a multiplicity of object fields 104 with the aid of the field facets 120. The field facets 120 generate a plurality of images of the intermediate focus on the pupil facets 122 respectively assigned thereto.

By way of an assigned pupil facet 122, the field facets 120 are imaged in each case onto the reticle 106 in a manner superposed on one another for the purposes of illuminating the object field 104. The illumination of the object field 104 is for example as homogeneous as possible. It can have a uniformity error of less than 2%. Field uniformity can be attained by overlaying different illumination channels.

The illumination of the entrance pupil of the projection optical unit 109 can be defined geometrically by way of an arrangement of the pupil facets. It is possible to set the intensity distribution in the entrance pupil of the projection optical unit 109 by selecting the illumination channels, for example the subset of pupil facets, which guide light. This intensity distribution is also referred to as illumination setting.

A likewise preferred pupil uniformity in the region of sections of an illumination pupil of the illumination optical unit 103 that are illuminated in a defined manner can be achieved by a redistribution of the illumination channels.

Further aspects and details of the illumination of the object field 104 and for example of the entrance pupil of the projection optical unit 109 are described hereinbelow.

The projection optical unit 109 may for example have a homocentric entrance pupil. The latter can be accessible. It can also be inaccessible.

The entrance pupil of the projection optical unit 109 generally cannot be illuminated exactly via the pupil facet mirror 121. The aperture rays often do not intersect at a single point when imaging the projection optical unit 109, which telecentrically images the center of the pupil facet mirror 121 onto the wafer 112. However, it is possible to find an area in which the spacing of the aperture rays, determined in pairwise fashion, is minimal. This surface area represents the entrance pupil or an area in real space that is conjugate thereto. For example, this area has a finite curvature.

The projection optical unit 109 might have different poses of the entrance pupil for the tangential beam path and for the sagittal beam path. In this case, an imaging element, for example an optical component of the transfer optical unit, should be provided between the second facet mirror 121 and the reticle 106. With the aid of this optical component, it is possible to take account of the different poses of the tangential entrance pupil and the sagittal entrance pupil.

In the arrangement of the components of the illumination optical unit 103 illustrated in FIG. 1, the pupil facet mirror 121 is arranged in an area conjugate to the entrance pupil of the projection optical unit 109. The field facet mirror 119 is tilted with respect to the object plane 105. The first facet mirror 119 is tilted with respect to an arrangement plane defined by the deflection mirror 118.

The first facet mirror 119 is arranged so as to be tilted with respect to an arrangement plane defined by the second facet mirror 121.

Figure 2:
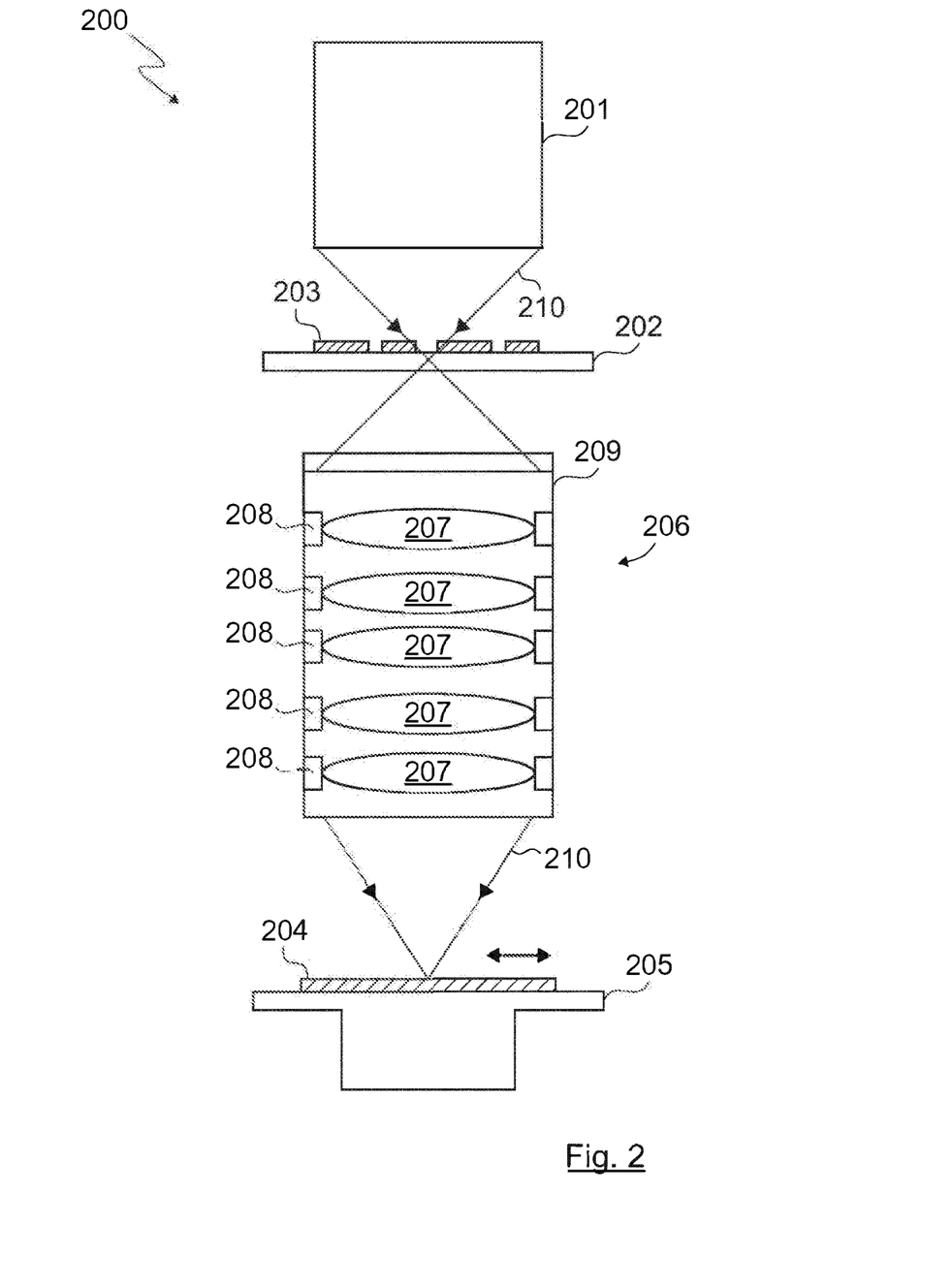
FIG. 2 shows a DUV projection exposure apparatus.

FIG. 2 shows an exemplary DUV projection exposure apparatus 200. The DUV projection exposure apparatus 200 comprises an illumination system 201, a device known as a reticle stage 202 for receiving and exactly positioning a reticle 203 by which the later structures on a wafer 204 are determined, a wafer holder 205 for holding, moving and exactly positioning the wafer 204, and an imaging device, specifically a projection optical unit 206, with a plurality of optical elements, for example lens elements 207, which are held by way of mounts 208 in a lens housing 209 of the projection optical unit 206.

As an alternative or in addition to the lens elements 207 illustrated, provision can be made of various refractive, diffractive and/or reflective optical elements, inter alia also mirrors, prisms, terminating plates and the like.

The DUV projection exposure apparatus 200 can make provision for the structures introduced into the reticle 203 to be imaged onto the wafer 204.

The illumination system 201 provides a projection beam 210 in the form of electromagnetic radiation, which is used for the imaging of the reticle 203 onto the wafer 204. The source used for this radiation may be a laser, a plasma source or the like. The radiation is shaped in the illumination system 201 via optical elements such that the projection beam 210 has the desired properties with regard to diameter, polarization, shape of the wavefront and the like when it is incident on the reticle 203.

An image of the reticle 203 is generated via the projection beam 210 and transferred from the projection optical unit 206 onto the wafer 204 in an appropriately reduced form. In this case, the reticle 203 and the wafer 204 can be moved synchronously, so that regions of the reticle 203 are imaged onto corresponding regions of the wafer 204 virtually continuously during what is called a scanning operation.

An air gap between the last lens element 207 and the wafer 204 can optionally be replaced by a liquid medium which has a refractive index of greater than 1.0. The liquid medium can be high-purity water, for example. Such a set-up is also referred to as immersion lithography and has an increased photolithographic resolution.

The use of the disclosure is not restricted to use in projection exposure apparatuses 100, 200, for example also not with the described structure. The disclosure and the following exemplary embodiments should also not be understood as being restricted to a specific design. The figures that follow illustrate the disclosure merely by way of example and in highly schematized form.

A targeted deformation of the optical elements 118, 119, 120, 121, 122, Mi, 207 of a projection exposure apparatus, for example of the projection exposure apparatuses 100, 200, might be suitable for correcting imaging errors thereof, for example. This is the starting point for the disclosure.

FIGS. 3 to 8 show various exemplary embodiments of optical assemblies 1 according to the disclosure in exemplary and very schematic fashion. The optical assemblies 1 enable a targeted deformation of an optical element 2, for example for correcting imaging errors in a projection exposure apparatus 100, 200.

As mentioned in the introductory part, the optical element 2 can be, for example, an optical element 2 of a projection exposure apparatus 100, 200, for example an optical element 2 within the illumination optical unit 103 and/or the projection optical unit 109, 206 of one of the projection exposure apparatuses 100, 200 described above (or of any other projection exposure apparatus).

In the exemplary embodiments, the optical element 2 is shown as a mirror and has an optically active front side with a reflective layer 3 and a back side 4 facing away from the front side. When incident on the optical element 2, the illumination radiation 115 or the projection beam 210 is influenced in defined fashion by the reflective layer 3. In general, the optical element 2 has a main body 5, which extends from the reflective layer 3.

Figure 3:
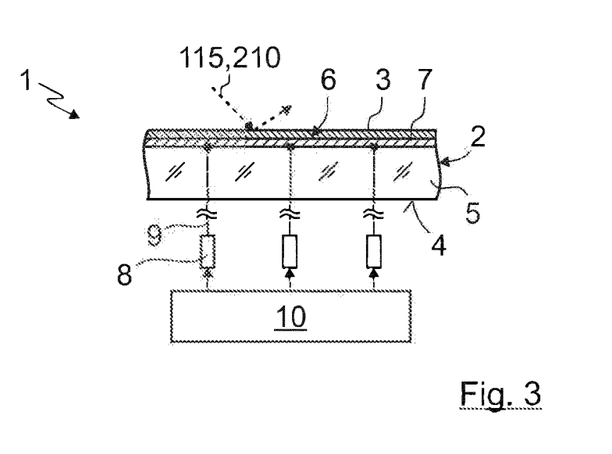
FIG. 3 shows an optical assembly with an optical element, a photostrictive component arranged within the optical element, and a plurality of light sources for illuminating the photostrictive component.

Initially, a first exemplary embodiment of the proposed optical assembly 1 is intended to be described on the basis of FIG. 3.

In addition to the optical element 2, the optical assembly 1 has an actuator device 6 for the deformation of the former. The actuator device 6 comprises at least one photostrictive component 7 and at least one light source 8. The photostrictive component 7 is mechanically coupled to the optical element 2 for the transmission of a tensile and/or compressive force, in order to deform the optical element 2, wherein the light source 8 is configured for the targeted illumination of the photostrictive component 7 in order to induce the tensile and/or compressive force in the photostrictive component 7. In the figures, corresponding light beams 9 are indicated by dashed lines.

The at least one photostrictive component 7 can be aligned parallel or at least substantially parallel to the optical element 2. However, an orthogonal or angled arrangement can also be provided, for example. At this point it should be noted that although the photostrictive components 7 are basically shown as homogeneous layers with the same layer thickness in the exemplary embodiments, the layer thickness can also be varied in order to achieve a different actuator effect in some regions, for example.

The photostrictive components 7 can be designed as thin layers, for example with a layer thickness of between 1 nm and 500 μm. Layer thicknesses of between 500 nm and 100 μm can be provided. The layer thickness influences the possible actuator amplitude and can be determined in such a way that an actuator amplitude of, for example, 1 nm or more is obtained.

The at least one photostrictive component 7 can in general be formed from any desired photostrictive material, for example from a ferroelectric material, a polar semiconductor, a non-polar semiconductor, or an organic polymer. The at least one photostrictive component 7 can be made from BiFeO3 or PbTiO3.

The at least one light source 8 can be designed to emit monochromatic light. The at least one light source 8 can also be designed to illuminate the photostrictive component 7 as much as possible in the form of a point and thus as focused as possible. In a variant, the at least one light source 8 can be in the form of a laser, for example a laser diode.

The light source 8 can be configured to emit light with a wavelength of between 100 nm and 1000 nm, for example with a wavelength of between 350 nm and 700 nm, for example 365 nm. Different types of photostrictive material are typically sensitive to different wavelength ranges. The light emitted by the at least one light source 8 can be matched to the photostrictive material used in each case. A wavelength of around 365 nm may be desirable for example for use with BiFeO3 or PbTiO3.

Provision may be made for the at least one light source 8 to be settable with regard to the wavelength, the intensity, the focusing, and/or the alignment of the emitted light. In this way, the deformation of the optical element 2 can be even more precisely influenced.

The actuator device 6 can have exactly one photostrictive component 7, which is designed as a contiguous material layer, for example as a film or foil, as shown in FIG. 3.

Various variants can be provided for the arrangement of the photostrictive components 7 on or in the optical element 2, which are presented below. Combinations of the variants mentioned are also possible in general.

As shown in FIG. 3, provision can be made, for example, for the at least one photostrictive component 7 to be arranged in the optical element 2 below the reflective layer 3 of the optical element 2. In this case, either the reflective layer 3 or the main body 5 is transparent to the light from the light source 8 in order to enable the excitation of the photostrictive component 7. As a rule, the main body 5 is made of glass anyway and is therefore transparent to the wavelength ranges mentioned above. Insofar as the main body 5 is transparent, the photostrictive component 7 can be illuminated on the back side of the optical element 2.

To illuminate the photostrictive component 7, a plurality of independently controllable light sources 8 are provided in FIG. 3 in order to illuminate the photostrictive component 7 in a targeted manner in a plurality of regions. To control the at least one light source 8, a control device 10 can be provided, which is configured to illuminate the at least one photostrictive component 7 by controlling the light source 8 in such a way that the intended deformation on the optical element 2 occurs. A corresponding computer program product with program code can be executed on the control device 10 in order to carry out a method for deforming the optical element 2.

A non-contact option for actuating or deforming the optical element 2 can be provided in a desired manner. With sufficient focusing, the light sources 8 can in general be disposed at any distance from the optical element 2. The wiring and/or heat dissipation from the light sources 8 can thus be possible in a simple manner.

In general, an arrangement of the light sources 8 spaced apart from the optical element 2 can be used. However, provision may also be made for at least one of the light sources 8 to be fixed directly on the back side 4 of the optical element 2, for example in a force-fitting, form-fitting or cohesive connection.

As an alternative or in addition to the arrangement shown in FIG. 3, further configurations of the actuator device 6 can also be provided, which will be presented below. In general, the disclosure should not be understood as being restricted to the illustrated exemplary embodiments.

Figure 4:
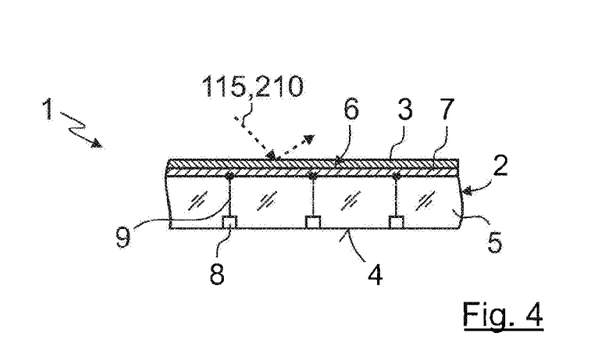
FIG. 4 shows an optical assembly with an optical element, a photostrictive component arranged within the optical element, and a plurality of light sources arranged within the optical element for illuminating the photostrictive component.

The exemplary embodiment of the optical assembly 1 shown in FIG. 4 largely corresponds to the exemplary embodiment in FIG. 3. Again, a photostrictive component 7 embodied as a contiguous material layer is arranged in the optical element 2 between the reflective layer 3 and the back side 4 of the optical element 2. In this way, the front side or the reflective layer 3 can be influenced in a targeted manner.

The control device 10 is not shown further in FIGS. 4 to 7 for the sake of simplicity.

In contrast to the arrangement of the light sources 8 according to FIG. 3, the light sources 8 in FIG. 4 are not disposed at a distance from the optical element 2 but are embedded in the optical element 2. For this purpose, the optical element 2 can be provided with corresponding recesses, for example, which extend into the optical element 2 starting from the back side 4. The light sources 8 can be accommodated in the optical element 2 in such a way that, starting from the back side 4 of the optical element 2, there is still a possibility of making contact.

Figure 5:
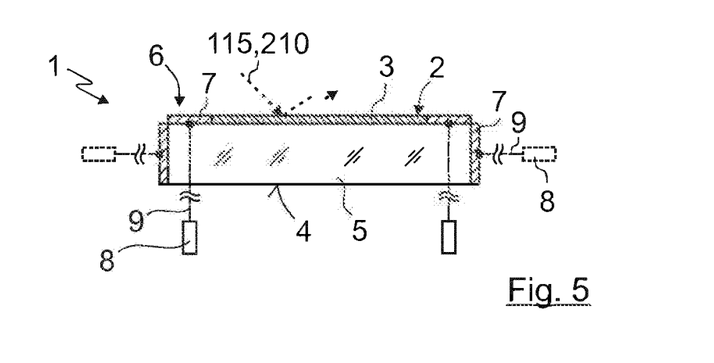
FIG. 5 shows an optical assembly with an optical element, a photostrictive component arranged on the front side of the optical element, and a plurality of light sources for illuminating the photostrictive component.

A further exemplary embodiment of an optical assembly 1 is shown in FIG. 5. Provision is made here for at least one of the photostrictive components 7 to be arranged on the front side of the optical element 2 next to the reflective layer 3. In this case, too, the photostrictive component 7 can be illuminated from the back side 4 of the optical element 2, as shown. Alternatively or additionally, however, the illumination can also take place from the front side or from the side of the optical element 2.

An alternative or additional variant can also be a mechanical attachment of the photostrictive component(s) 7 to the sides of the optical element, which is indicated in FIG. 5 by dashed lines.

The mechanical coupling shown in FIG. 5 between the at least one photostrictive component 7 and the optical element 2 can cause, for example, very good suppression of deformations of the optical element 2 in the peripheral regions and/or introduce long-wave deformations into the optical element 2.

Figure 6:
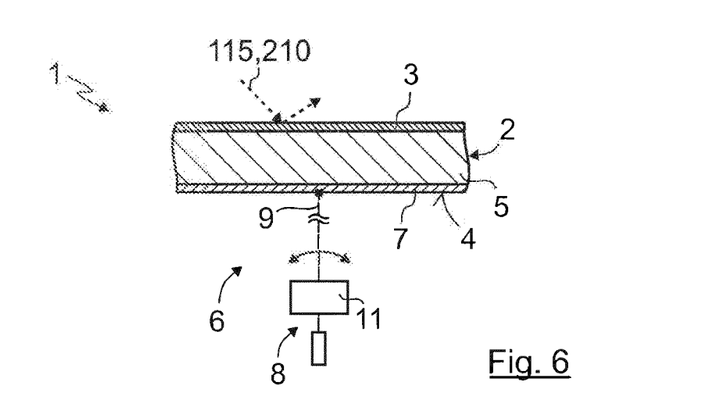
FIG. 6 shows an optical assembly with an optical element, a photostrictive component arranged on the back side of the optical element, and a light source for illuminating the photostrictive component.

A further exemplary embodiment of an optical assembly 1 is shown in FIG. 6. The at least one photostrictive component 7 is mechanically connected, for example directly connected, here to the back side 4 of the optical element 2. The photostrictive component 7 can, for example, be adhesively bonded to the back side 4 of the optical element 2 or be vapor-deposited on the back side 4 of the optical element 2. In general, any attachment techniques can be provided. In this case, it is also no longer absolutely necessary for the main body 5 and/or the reflective layer 3 to be transmissive to the light from the light source 8 in order to provide the possibility of illuminating the photostrictive component 7.

FIG. 6 also shows a further possibility for irradiating the photostrictive component 7 with a single light source 8 (or with a reduced number of light sources 8). The light source 8 has an additional optical device 11, for example one or more lens elements, one or more micromirrors, and/or one or more light filters, in order to influence the beam path and/or the properties of the emitted light. The optical device 11 is indicated only schematically in FIG. 6 as a black box. Because the beam path from the light source 8 can be influenced, a plurality of regions of the at least one photostrictive component 7 can be illuminated (possibly also with different intensities and/or wavelengths), without a plurality of light sources 8 necessarily being provided for this purpose.

Figure 7:
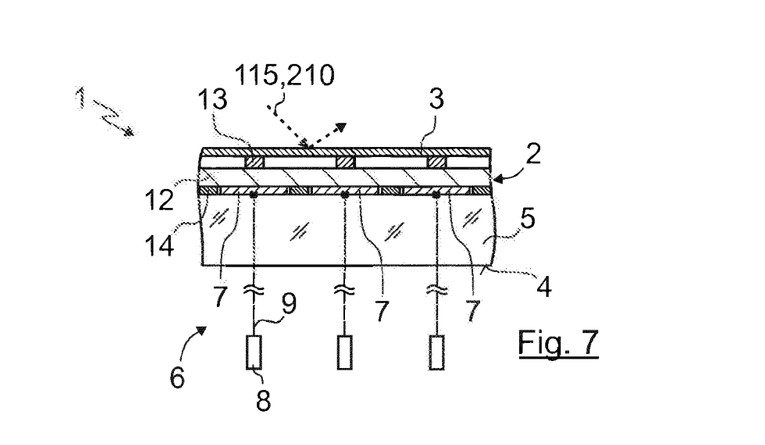
FIG. 7 shows an optical assembly with an optical element, a plurality of photostrictive components mechanically coupled to the back side of the optical element via an intermediate element, a reference body, and a plurality of light sources for illuminating the photostrictive component.

The exemplary embodiment in FIG. 7 is intended to illustrate that significantly more complex arrangements of the optical element 2 and the actuator device 6 can also be provided within the scope of the disclosure.

As shown in FIG. 7, provision can be made for the photostrictive component 7 to be connected indirectly to the reflective layer 3 of the optical element 2. For this purpose, an intermediate layer 12 can be provided between the at least one photostrictive component 7 and the reflective layer 3. The photostrictive components 7 can be attached directly to the intermediate layer 12, which in turn is attached directly or indirectly to the reflective layer 3. In the exemplary embodiment in FIG. 7, optional spacer struts 13 are provided between the intermediate layer 12 and the reflective layer 3 in order to enable an even more targeted transmission of force.

The at least one photostrictive component 7 can be arranged between the main body 5 of the optical element 2 and the reflective layer 3 and can be connected directly to the main body 5, for example. Finally, the other side of the photostrictive component 7 can be connected on the back side to the reflective layer 3 of the optical element 2, for example via the intermediate layer 12 shown. The main body 5 can, for example, be connected to the reflective layer 3 or, as shown, to the intermediate layer 12 via individual bearing struts 14.

In the variant of the disclosure shown in FIG. 7, the main body 5 is can be designed to be transparent to the light from the light source 8.

As is likewise shown in FIG. 7, provision can be made for arranging a plurality of photostrictive components 7 selectively distributed along the optical element 2, for example between the bearing struts 14. In general, however, a configuration of the photostrictive component 7 as a single, contiguous material layer can be used.

What is claimed is:

1. An optical assembly, comprising:
an optical element configured to influence a beam path in a projection exposure apparatus; and
an actuator device configured to deform the optical element, the actuator device comprising a photostrictive component and a light source,
wherein:
the photostrictive component is mechanically coupled to the optical element to transmit a tensile force and/or a compressive force to deform the optical element;
the light source is configured to targetedly illuminate the photostrictive component to induce the tensile and/or compressive force in the photostrictive component;
the optical element comprises an optically active front side comprising a reflective layer configured to influence a beam path from a radiation source;
the optical element comprises a back side facing away from the front side of the optical element; and
at least one of the following holds:
i) the photostrictive component is on the front side of the optical element next to the reflective layer;
ii) the actuator device comprises a plurality of the photostrictive components distributed along the optical element and mechanically connected to the back side of the optical element.

2. The optical assembly of claim 1, wherein the optical element comprises a main body extending from the back side of the optical element to the reflective layer, and the main body comprises a material that is at least partially transparent to the light from the light source.

3. The optical assembly of claim 1, wherein the photostrictive component is in the optical element between the reflective layer and the back side (4) of the optical element.

4. The optical assembly of claim 1, wherein the photostrictive component is parallel to the optical element.

5. The optical assembly of claim 1, wherein exactly one photostrictive component is a contiguous material layer.

6. The optical assembly of claim 1, wherein the photostrictive component is layer having a thickness between 1 nm and 500 µm.

7. The optical assembly of claim 1, wherein the photostrictive component comprises a material selected from the group consisting of BiFeO3 or PbTiO3.

8. The optical assembly of claim 1, wherein the light sources comprises a laser.

9. The optical assembly of claim 1, wherein the light source is configured to emit light having a wavelength between 100 nm and 1000 nm.

10. The optical assembly of claim 1, wherein the light source is settable with regard to its emission wavelength, its emission intensity, its emission focus focusing and/or its emission alignment.

11. The optical assembly of claim 1, wherein the light source comprises an optical device.

12. The optical assembly of claim 1, further comprising a control device configured to control the light source to illuminate the photostrictive component to achieve an intended deformation of the optical element.

13. The optical assembly of claim 1, comprising a plurality of independently controllable light sources configured to illuminate the photostrictive component.

14. An apparatus, comprising:
an illumination optical unit;
a projection optical unit; and
an optical assembly according to claim 1,
wherein the apparatus is a projection exposure apparatus, and the optical assembly is in the illumination optical unit or the projection optical unit.

15. A method, comprising:
using the optical assembly of claim 1 to deform the optical element.

16. An optical assembly, comprising:
an optical element configured to influence a beam path in a projection exposure apparatus; and an actuator device configured to deform the optical element, the actuator device comprising a photostrictive component and a light source,
wherein:
   the photostrictive component is mechanically coupled to the optical element to transmit a tensile force and/or a compressive force to deform the optical element;
   the light source is configured to targetedly illuminate the photostrictive component to induce the tensile force and/or the compressive force in the photostrictive component;
   the optical element comprises an optically active front side comprising a reflective layer configured to influence a beam path from a radiation source;
   the optical element comprises a back side facing away from the front side of the optical element; and
   at least one of the following holds:
      i) the light sources is fixed on the back side of the optical element; and
      ii) the photostrictive components is in the optical element between the reflective layer and the back side of the optical element, and the light source is in the optical element between the photostrictive component and the back side of the optical element.

17. The optical assembly of claim 16, wherein the photostrictive component is on the front side of the optical element next to the reflective layer.

18. The optical assembly of claim 16, wherein the light source is in the optical element between the photostrictive component and the back side of the optical element.

19. The optical assembly of claim 16, wherein the photostrictive component is mechanically connected to the back side of the optical element.

20. An apparatus, comprising:
an illumination optical unit;
a projection optical unit; and
an optical assembly according to claim 16,
   wherein the apparatus is a projection exposure apparatus, and the optical assembly is in the illumination optical unit or the projection optical unit.

\* \* \* \* \*

UNITED STATES PATENT AND TRADEMARK OFFICE
CERTIFICATE OF CORRECTION

PATENT NO. : 12,360,459 B2
APPLICATION NO. : 18/453750
DATED : July 15, 2025
INVENTOR(S) : Tim Hoffmann et al.

It is certified that error appears in the above-identified patent and that said Letters Patent is hereby corrected as shown below:

In the Specification

Column 2, Line 3, delete "desibly" and insert -- desirably --.

In the Claims

Column 21, Line 17, in Claim 16, delete "elment;" and insert -- element; --.

Signed and Sealed this
Sixteenth Day of September, 2025

Coke Morgan Stewart
*Acting Director of the United States Patent and Trademark Office*